United States Patent [19]

Walls et al.

[11] 4,435,496

[45] Mar. 6, 1984

[54] PHOTOPOLYMER CLEAVAGE IMAGING SYSTEM

[75] Inventors: John E. Walls, Wiesbaden Biebrich, Fed. Rep. of Germany; Tulay Duyal, Englishtown, N.J.

[73] Assignee: American Hoechst Corporation, Somerville, N.J.

[21] Appl. No.: 421,685

[22] Filed: Sep. 22, 1982

[51] Int. Cl.³ ............................................. G03C 1/727
[52] U.S. Cl. .................................... 430/285; 430/286; 430/288; 430/326; 204/159.14
[58] Field of Search ............... 430/286, 287, 285, 288, 430/326; 204/159.14

Primary Examiner—John E. Kittle
Assistant Examiner—Cynthia Hamilton
Attorney, Agent, or Firm—Richard S. Roberts

[57] ABSTRACT

Disclosed are novel photosensitive compositions containing a compound consisting essentially of repeating structural units of an alkyl aryl ether, which are end-capped with a substituent functional group containing an ethylenically unsaturated moiety, and a photosensitizing effective amount of a free radical generating compound. Through the selected exposure of films and coatings prepared from the above composition, it is possible to record information in such materials in a manner as to alter the physical and/or chemical properties of such films and coatings. This selective modification can then be simply manifested by contacting the exposed surface of the film or coating, subsequent to such exposure, with an alkaline developing solution. These compositions are useful in the graphic arts and in the manufacture of printed circuit boards for the electronics industry.

9 Claims, No Drawings

PHOTOPOLYMER CLEAVAGE IMAGING SYSTEM

BACKGROUND OF THE INVENTION

This invention relates to a composition of matter, a method and an article of manufacture. More specifically, the subject invention is directed to a photosensitive composition which readily undergoes selective alteration in its physical and/or chemical properties upon image-wise exposure to activating electromagnetic radiation. The photosensitive composition can be readily formed, independent of binders, into films or adherent coatings useful in the graphic arts and in the manufacture of circuit boards for the electronics industry.

The use of photosensitive films and coatings in both the graphic arts and in the manufacture of circuit boards is well known. Typically, the composition of such films and coatings can include a polymeric constituent, which may itself be photosensitive, and a sensitizer composition. Upon selected exposure of this film or coating to imaging energies, the photosensitive species within the composition would either itself undergo a degradative reaction or promote degradation of one or more of the other components of the composition. It is, of course, readily appreciated that such degradative reaction is only of value in such a system where it is essentially confined, or limited, to those areas of the composition impinged upon by such imaging energies. The concept of "degradation" as used throughout this disclosure is contemplative of any photoinduced alteration or shift in one or more of the physical and/or chemical properties of the composition. The image thus created within the film or coating can then be "developed" by selective removal of the exposed components of the film or layer which have been subjected to imaging energies. The ability to create such selective degradative changes in films and coatings prepared from a photosensitive composition has been appreciated for some time. The basic difference in the various approaches in the formulation of such photosensitive compositions has been in the search for a system which is prepared from relatively inexpensive ingredients, does not require prolonged imaging cycles (has a high quantum efficiency) and results in the creation of high resolution images within the composition which can be manifested without prolonged and elaborate development.

The various mechanisms for selective photodegradative changes in photosensitive polymeric films and coatings include:
(a) hydrogen extraction from a polymer backbone by a photosensitive species as disclosed in U.S. Pat. No. 3,964,907;
(b) acid catalyzed depolymerization of a degradable polymer as disclosed in U.S. Pat. No. 3,917,483; and
(c) oxonium ion-induced cleavage of a degradable polymer as disclosed in U.S. Pat. No. 3,923,514.

All of the foregoing references disclose the application of one or more of the above mechanisms to the selective photodegradation of photosensitive compositions containing formaldehyde, or an aldehyde linkage.

It is an object of this invention to provide a novel polymeric photosensitive composition having enhanced mechanical and physical properties.

A further object of this invention is to provide a novel polymeric photosensitive composition wherein the photodegradable polymer component thereof is of sufficient molecular weight to form a tough adherent film or coating with or without binders.

Still yet a further object of this invention is to provide a novel polymeric photosensitive composition which has improved mechanical and physical properties, and which can be readily developed by simple contact with an alkaline solution.

SUMMARY OF THE INVENTION

The above and related objects are achieved by providing a photosensitive composition comprising
(a) a polymer component comprising a plurality of structural units of alkyl aryl ethers which are end-capped with a substituent functional group containing an ethylenically unsaturated moiety, and
(b) a photosensitizing effective amount of a free radical generating compound for example those selected from the group consisting of benzophenone, benzil, benzoin, acetophenone, thioxanthone, anthraquinone and the substituted analogues thereof.

The molecular weight of the above polymer can be sufficient to form tough adherent films and coatings which may be essentially independent of binders, and yet are readily capable of undergoing selective free-radical induced degradation upon impingement by activating electromagnetic radiation. The high quantum yield obtainable in this system from the relatively low levels of sensitizer provide an efficient, yet economical, system which is amenable to simple development of the recorded information by contact of the exposed surface of the film or coating with an alkaline solution.

DETAILED DESCRIPTION OF THE PREFERRED EMBODIMENTS

The photosensitive compositions of this invention are prepared by combining, in the appropriate relative proportions, an alkyl aryl ether based polymer and a photosensitizer, which upon exposure to ultraviolet or actinic radiation, effects a selective cleavage of the polymer into lower molecular weight fractions.

The alkyl aryl based polymer of this invention can be prepared by
(a) self-condensation of an alkyl aryl ether;
(b) condensation of two or more alkyl aryl ethers; or
(c) condensation of an alkyl aryl ether with paraformaldehyde.

The alkyl aryl ether monomers which are suitable in preparation of the foregoing polymers can be represented by the following formula:

wherein M is an aromatic radical of a compound selected from a group consisting of aromatic hydrocarbons, diaryl ethers, diaryl sulfides, diaryl sulfones, diaryl amines, diaryl ketones, and diaryl diketones; and R is

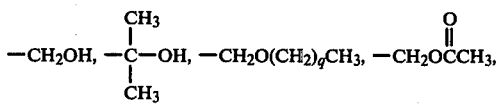

q is 0 to 3

Alkyl aryl ether monomers corresponding to the above formula which are suitable for use in preparation of polymers for the photosensitive compositions of this invention non-exclusively include the following:
1,5-diacetoxy methyl naphthalene
1,4-dihydroxy methyl naphthalene
2,6-dihydroxy methyl naphthalene
9,10-dimethoxy methyl anthracene
4,4'-Bis-methoxy methyl diphenyl methane
4,4'-Bis-acetoxymethyl diphenyl sulfone
4,4'-Bis-methoxy methyl benzophenone
4-hydroxy-3,5'-bis-hydroxy methyl diphenyl ether
2,2'-Bis-hydroxy-3,3'-bis-hydroxy methyl diphenyl methane
1,3-(3-hydroxy methyl phenoxy) propane
1,5-(4-hydroxy methyl phenoxy) pentane
Bis-2-(4-hydroxy methyl-phenoxy) ethyl ether
4,4'-Bis-hydroxymethyl diphenyl ether
4,4'-Bis-acetoxy methyl diphenyl ether
4,4'-Bis-methoxy methyl diphenyl ether
4,4'-Bis-ethoxy methyl diphenyl ether
2,4,4'-Tris-methoxy methyl diphenyl ether
4,4'-Bis-methoxy methyl diphenyl sulfide
3,3'-Bis hydroxy-2,4'-Bis methoxy methyl diphenyl sulfide
1,3-(4-methoxymethyl phenoxy)-benzene
1,3-(4-methoxymethyl-phenoxy)-propane
4,4'-Bis-methoxy methyl benzil Although all of the above are quite suitable for the above stated purpose, the monomers listed below are preferred:
4,4'-Bis-hydroxy methyl diphenyl ether
4,4'-Bis-methoxy methyl diphenyl ether
4,4'-Bis-methoxy methyl diphenyl sulfide
4,4'-Bis methoxy methyl benzophenone
4,4'-Bis-acetoxy methyl diphenyl methane In an alternate embodiment, additional monomers following the R-M-R formula wherein R is —CH$_2$I, —CH$_2$Cl or —CH$_2$Br may be used to construct the polymer of this invention. However, these methyl halide based monomers may not be used alone to form the subject polymer. They may only be used in admixture with a substantial amount of R-M-R monomers which are ethers.

The condensation of the foregoing monomers is preferably carried out in an acidic medium. The selection of acid is based upon the relative reactivities of the monomers. Sulphuric acid is normally the strongest acid that one would use in this polymerization and thus would be reserved for the least reactive monomer. Conversely, where the monomer is highly reactive, a less acidic agent would be preferred. In the majority of these cases, phosphoric acid is the acid of choice. The temperature of the condensation reaction can range from about −10° C. to about 70° C. and preferably between 5° C. and 50° C. Ordinarily, at these temperatures, reaction intervals can vary from about 15 minutes to about 30 hours depending upon the relative reactivity of the monomer, the desired molecular weight of the product and the ease of control of the exothermic reaction. The exotherm of the polymerization reaction is carefully monitored and controlled in order to prevent runaway polymerization of the monomer and thus avoid the synthesis of high molecular weight substances of limited solubility.

Once the polymer has been prepared in the foregoing manner, it is washed for removal of residual monomers and other chemicals associated with the polymerization reaction. It is, thereafter, isolated by conventional means and dried.

The dried polymer is then further reacted with preferably an unsaturated halogen containing compound as hereinafter described, thereby introducing ethylenically unsaturated functional groups at the terminal ends of the polymer in order to obtain the novel materials of this invention.

The dried polymer is dissolved in a non-reactant solvent such as tetrahydrofuran, dimethylformamide or dioxane together with an acid scavenger such as pyridine, mono-, di- or tri-ethyl or ethanol amine. The unsaturated halogen containing compound is then added and the reaction is allowed to run for from about 15 to 48 hours at 10° C. to 80° C.

The halogen containing compounds which can be reacted with the polymer can be represented by the following structural formula:

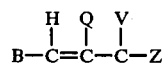

where B is H, aryl, alkyl, aralkyl or phenoxy phenyl
Q = H, CH$_3$
Z = H$_2$ or =O
V = halogen Representative compounds of the above formula which are suitable for use in the foregoing synthesis include acrylol halides, the various homologs of acrylol halides, cinnamoyl halides, allyl halides and phenoxy cinnamoyl halides.

These compounds are combined with the polymer, in the appropriate relative proportion, in a suitable reaction medium as described and the reactants allowed to interact with one another. The reaction medium in which such compounds are combined is capable of removing any residual acid contained within the polymer. Once the reactants have been heated to the appropriate temperature and the mixture is allowed to age, the solution containing the reaction product is added to water to facilitate precipitation and separation of the product from the reaction medium. The precipitate is recovered by filtration and washed repeatedly for removal of residual solvent. The polymer thus obtained is dried until essentially free of the fluid residues. The polymer prepared in the foregoing manner can be represented by the following structural formula:

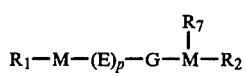

Wherein:
E is selected from the group consisting of one or more of:

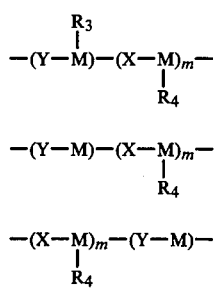

-continued

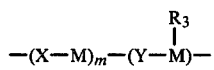

$R_1$, $R_2$ is

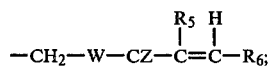

$R_5$ is $H_1$ or $CH_3$
$R_6$ is H, aryl, alkyl, aralkyl or phenoxy phenyl
W is —O— when Z is =O or is absent when Z is $H_2$
Z is $H_2$ or =O
$R_3$ is selected from the group consisting of:

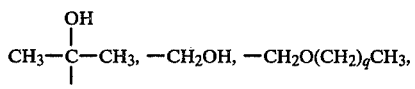

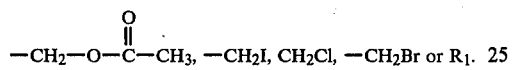

where q=0 to 3; and
M is an aromatic radical selected from the group consisting diaryl aliphatic, diaryl ethers, diaryl sulfides, diaryl sulfones, diaryl amines, diaryl ketones and diaryl diketones; and
$R_4 = R_3$
G = X or Y
$R_7 = R_4$ when S=X or is absent when S=Y
m = 1 to 3
p = 1 to 8
Y = —$CH_2OCH_2$—
X = —$CH_2$—

In the preferred embodiment the ratio of X:Y ranges from 1:1 to 3:1, and is more preferably 2:1.

The sensitizer, which can be combined with the foregoing polymer in the formulation of the compositions of this invention, can be any material which is essentially compatible with the above polymer and capable, upon activation by imaging energies, of effecting a degradation of such a polymer through a free radical mechanism. It is postulated that the transition of the sensitizer from the ground to the excited state induces free radical formation within the polymer resulting in its fragmentation to lower molecular weight segments. These sensitizers generally have a range of photoresponse substantially outside the range of primary photoresponse of the polymer. Representative of the sensitizers that can be used in the photosensitive compositions of this invention non-exclusively include the benzophenones, benzil, benzoin, acetophenone, thioxanthone, anthroquinone and the substituted analogues thereof. Substitutions may be methyl, ethyl, n-propyl, iso-propyl, n-butyl, t-butyl, hexyl, methoxy, ethoxy, n-propoxy, iso-propoxy, butoxy, acetoxy, dimethyl amine and diethyl amine.

The photosensitive compositions of this invention can also optionally include various other art recognized polymers or non-polymeric additives to modify and/or impart one or more changes in the physical properties and/or stability of the resultant composition. Representative of the polymers which can be used in conjunction with the photosensitive compositions of this invention include polymeric binder materials, light speed accelerators, photostabilizers, colorants, fillers and other auxiliary agents intended to enhance or modify one or more of the physical properties of the resultant composition. Of course, any such modifier addition to the composition must not substantially interfere with either the excitation of the sensitizer compound or its interaction with the alkyl aryl ether based polymer. It is contemplated that through the use of such optional ingredients, it may be possible to effect changes in the films and coatings prepared from these compositions so as to manifest the imaging energy in variety of different ways.

Non-limiting examples of binders include polyvinyl acetals, polymethacrylate, methyl methacrylate, ethyl methacrylate and acrylic acid copolymers thereof, novolak resins, polyvinyl acetates and polyvinyl chlorides.

Non-limiting examples of colorants include phthalocyanine pigments such as Hoechst Hostaperms and DuPont Monoastrals, and dyes such as acid dyes, oil soluble dyes, Victoria Blue, Samaron Blue, Alizarin Red, and Sudan Red.

Useful photostabilizers include the Uvinals made by GAP and Tinuvins made by Ciba-Geigy.

A film or coating can be prepared from the foregoing materials by dissolving the components of the film or coating in a common solvent and thereafter casting or coating the resultant solution on an appropriate substrate. As noted hereinabove, the essential components of the photosensitive composition are capable of forming self-supporting films and coatings which may be independent of binders. The relative concentration of each of the materials which is present in the composition should be carefully adjusted to assure the maximum sensitivity of the film to imaging energies while at the same time insuring that the resultant physical properties of the film are kept within the limits required by the end use of the product. For example, where the photosensitive composition is intended to form a self supporting film, the relative concentration of polymer to sensitizer should be adjusted to insure sufficient mechanical strength and internal cohesion consistent with this objective. Conversely, where the photosensitive composition is to be applied as a coating on a substrate, then the requirements of the composition may differ. Solvents which are suitable for forming films and coatings of the composition include 2-methoxy-ethanol, 2-methoxy-ethyl acetate, ethyl acetate, butyl acetate, N,N-dimethylformamide (DMF), tetrahydrofuran (THF), xylene, methyl ethyl ketone, and the like. In a typical formulation of the photosensitive compositions of this invention, the relative proportion of sensitizer to polymer usually ranges from about 1:10 to about 5:6 and preferably from about 1:2 to about 1:3.

The substrates which can serve as a supporting base for the photosensitive coatings of this invention can include virtually any material traditionally used in the graphic arts and in the fabrication of circuit boards for the electronics industry; the only requirement being that the substrate is relatively inert and non-reactive with the coating prepared from the photosensitive compositions of this invention. These include aluminum alloys, silicon, polyesters and other plastics with or without art recognized surface treatments.

The preferred embodiment uses a sheet metal substrate, preferably aluminum and the alloys thereof, especially those aluminum compositions suitable for the manufacture of lithographic printing plates such as Alcoa 3003 and Alcoa 1100 which may or may not be pretreated by standard pretreatments such as gaining and/or etching and/or anodizing techniques as are well known in the art, and also may or may not have been treated with a composition suitable for use as an interlayer for lithographic plates.

Interlayer compositions employable in the practice of this invention include treatments with aqueous solutions of polyvinyl phosphonic acid, alkali silicate, silicic acid, the Group IV-B metal fluorides, polyacrylic acid, the alkali zirconium fluorides, such as, potassium zirconium hexafluoride, or hydrofluozirconic acid in concentrations of 0.5% to 20% by volume coated by spraying, brushing, dipping or other equivalent means.

Once the films and coatings have been prepared from the aforedescribed material and applied to the appropriate substrate, they can be subjected to imagewise exposure to activating electromagnetic radiation. The interval and intensity of exposure can vary and are principally dependent upon the degree of photoresponse of the sensitizer to such ultraviolet or actinic radiation and the amount of degradation required for the particular application in which this composition is employed. Sources of such radiation can include mercury vapor lamps, lasers, and projection techniques. The photosensitive composition is usually exposed to imaging energies by simple masking the photosensitive film or coating followed by flood exposure.

Once having exposed the film prepared from the photosensitive composition to the requisite imaging energies, the image information can be developed through simply contacting the surface of the film or coating with an aqueous alkaline solution as is well known in the art. The developer is chosen for its greater affinity for those portions of the composition which have been exposed to imaging energies than to those portions of the composition which have been unexposed to similar energy. The action of the developer on the film can result in the selective removal of the more soluble component thereof; thereby creating a image. The image can then be used as a basis for printing or as a photoresist.

Developers include aqueous alkaline solutions of sodium, potassium, lithium or ammonium hydroxide, carbonate, phosphate and silicate. These include NaOH, KOH, LiOH, $Na_2CO_3$, $Na_3PO_4$, $NaHCO_3$, $Na_2HPO_4$ and $Na_2SiO_3$ as well as mixtures thereof. The hydroxides are most effective between 0.25 and 5.0%. The phosphates and carbonates are most effective between 1.0 and 12% and the silicates are most effective between 0.1% and 8%. $K^+$, $Li^+$ and $NH_4^+$ salts may also be used with or in lieu of $Na^+$.

The following Examples are provided to illustrate some of the more preferred embodiments of this invention. Parts and percentages appearing in these examples are by weight unless otherwise stipulated.

EXAMPLES

Example I 25.8 gr of 4,4'-Bis-methoxymethyl diphenyl ether are slowly titrated into 113.5 gr of phosphoric acid (85%) which has dissolved in it 6.0 gr of paraformaldehyde. During the dropwise addition of the diphenyl ether into the acid, vigorous agitation is maintained. A temperature of 40° C. is maintained during the reaction period as well as during the time of aging. After four (4) hours of aging, the solution is added to four (4) liters of water. The reaction product precipitate is isolated and well washed to remove all acid residue. It is then placed in vacuum over at 40° C. and dried.

16.0 gr of the product obtained from the foregoing reaction is dissolved in 50.0 gr of pyridine. The solution is heated to 50° C. and allowed to stir for two (2) hours. While maintaining an isothermal state at 50° C., 4.0 gr of cinnamoyl chloride is added and allowed to stir for four (4) hours. At this time, 10 g of acetone is added. To this is then added one (1) liter of deionized water to precipitate the final product. The product is washed with 0.1 N HCl to remove all traces of pyridine. The precipitate is dried in a vacuum oven until all water is removed.

The resin product is an off-white substance which is then ground into a fine powder. 3.0 gr of this resin is dissolved into 96.0 gr of tetrahydrofuran (THF). Also added is 1.0 gr of 2-ethylanthraquinone. The solution is whirler coated onto an aluminum surface having been prepared by degreasing, wet graining with quartz and treated as described in U.S. Pat. No. 3,160,506 so as to render the surface hydrophilic. This patent is incorporated by reference. The coated plate is exposed imagewise using a positive and negative target having various degrees of resolution with line work and half-tones. The test flat is placed on the plate with the emulsion side against the coating. A good vacuum is created and the plate is exposed with 250 $mJ/cm^2$ of UV radiation. After exposure, the plate is developed with either an alkaline developer (1.0 N NaOH+2.0% $Na_2SiO_3$) or a subtractive aqueous solvent developer as described in U.S. Pat. No. 4,308,340 which is also incorporated by reference. After development and exposure, no visible image can be seen. When development is complete, a rub-up ink is used to observe the image. The hydrophilic background repels the ink while the oleophilic image readily accepts it. In the particular instance of this experimental plate, a positive image is seen where the positive flat is used and negative image where the negative flat is used. There exists an esstentially 1:1 ratio between flat and image. Further, the resolution is considered to be comparable to known systems.

A plate is prepared so as to evaluate the quality of performance when using it on a printing press. A clean roll-up is observed where the image holds a full charge of ink and the printed copy has full solid image areas. Retention of detail in the line work and half-tones closely matches the original flat used to make the plate.

EXAMPLE II

The compound prepared in Example I is evaluated for utility as a resist by likewise preparing a coating on an aluminum plate. It is known that when a solution of stannous chloride is placed in contact with aluminum, the resulting reaction causes formation of black spots on the aluminum. This technique is recognized as useful in evaluating a resist. There is a direct relationship between the elapsed time it takes for the stannous chloride to penetrate the coating and its effectiveness as a resist. A control plate having areas protected with the product of the present invention has applied to it an amount of stannous chloride solution. The unprotected areas of the plate develop spots in fourteen (14) seconds, whereas the area protected by the coating requires 257 seconds to develop spots.

EXAMPLE III

In like manner as described in Example II, an imaged plate is prepared. A portion of the coated plate is immersed in 1.0 N HCl solution for five (5) minutes after which it is evaluated using the stannous chloride test. In this instance, 231 seconds are required to produce a reaction in the area protected by the resist.

EXAMPLE IV

In like manner as described in Example II, an imaged plate is prepared. A portion of the coated plate is immersed in 0.1 N NaOH solution for five (5) minutes after which it is evaluated using the stannous chloride test. In this instance, the plate is etched by the NaOH solution and in the non-protected area gives an immediate reaction. The resist area is irregular due to the undercutting of the alkaline solution but in the center resists the stannous chloride for 207 seconds.

EXAMPLE V 28.6 gr of 4,4'-Bis methoxy methyl benzophenone are dissolved in 115.0 gr of phosphoric acid (85%) and allowed to stir for two (2) hours at 40° C. to permit the self condensation reaction to proceed. After this period of aging, the solution is added to two (2) liters of water to precipitate the product. The resinous precipitate is well washed to remove all residual acid and dried.

3.0 gr of the dried product are dissolved into 96.0 gr of DMF containing 1.0 gr of ethyl anthraquinone and whirler-coated onto an aluminum substrate as described in Example I. Using a test flat, an exposure of 250 mJ/cm$^2$ to UV radiation is made. The exposed plate is developed and then inked. Initially, a weak positive image is observed but it is then rubbed away easily. It can thus be concluded that where the polymwer is not end-capped with the ethylenically unsaturated acid chloride salt, plate performance is not comparable to Example I.

EXAMPLE VI 14.3 gr of 4,4'-Bis-methoxy methyl benzophenone is dissolved in 55 gr pyridine. This mixture is stirred for two (2) hours at 50° C. after which 3.9 gr of acrylol chloride is added, with continuous stirring, and the reaction run for 30 hours. After aging, the solution is poured into 2.0 liters of water to precipitate the product. The product is recovered by filtration after washing and drying.

3.0 gr of the polymeric product is dissolved into 96.0 gr DMF plus 1.0 gr of ethyl anthraquinone and is whirler-coated into an aluminum substrate as described in Example I using a test flat, the plate is exposed with 250 mJ/cm$^2$ of UV radiation. The exposed plate is developed and then inked. Initially, there is a weak image. In this instance, the image is fully negative. After some light rubbing, the image is easily removed. From this example, it can be concluded that a precondensation reaction of the monomer is essential prior to reacting with the unsaturated compound. With no polymer formation, there is no integrity and the image is negative rather than positive.

EXAMPLE VII 14.3 gr of the product described in Example V, where the 4,4'-Bis-methoxy methyl benzophenone is reacted with itself, is dissolved in 55 gr of pyridine. The mixture is stirred for two (2) hours at 50° C. after which 3.9 gr of acrylol chloride is added, with continuous stirring, and the reaction run for 30 hours.

After aging, the solution is poured into 2.0 liters of water to precipitate the product. The resin is well washed to remove all traces of solvent and is then dried.

3.0 gr of the dried polymeric product and 1.0 gr of ethylanthraquinone are dissolved in 96.0 gr of THF and whirler-coated onto an aluminum plate. Using a test flat, the plate is exposed with 250 mJ/cm$^2$ of UV radiation. The exposed plate is developed and inked. A strong positive image is observed which has good resolution and adhesion to the substrate.

EXAMPLE VIII 3.0 gr of paraformaldehyde is dissolved into 115 gr of phosphoric acid (85%). The temperature of the acid is adjusted to 40° C. and 14.3 gr of 4,4'-Bis-methoxy methyl benzophenone is added with constant agitation. The solution is allowed to age for 2.0 hours after which time 2.0 liters of water is added to precipitate the condensate. The precipitate is washed and neutralized to remove all traces of acid and then dried.

3.0 gr of the dried resin and 1.0 gr of ethyl anthraquinone are dissolved in 96.0 gr of THF and whirler-coated onto an aluminum plate. Using a test flat, the plate is exposed with 250 mJ/cm$^2$ of UV radiation. The plate is developed and inked. A strong positive image is observed which has good resolution and is well anchored to the substrate.

EXAMPLES IX THROUGH XII

Products of Examples V through VIII are evaluated as resists by using the stannous chloride test. The results are tabulated below:

| | | RESISTANCE TO SnCl$_2$ SATURATION (IN SECONDS) | | | | | |
|---|---|---|---|---|---|---|---|
| | Product | | | 1.0N Hcl | | 0.1N NaOH | |
| | of | Control | | (5 min) | | (5 min) | |
| Ex.# | Ex. No. | Bkgd | Image | Bkgd | Image | Bkgd | Image |
| 9 | 5 | 14 | 14 | 9 | 10 | Immed | Immed |
| 10 | 6 | 14 | 15 | 8 | 10 | Immed | Immed |
| 11 | 7 | 14 | 228 | 9 | 521 | Immed | 213 |
| 12 | 8 | 14 | 213 | 9 | 254 | Immed | 249 |

What is claimed is:
1. A photosensitive composition comprising
(a) a polymer of the formula

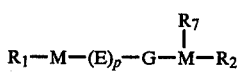

Wherein:
E is selected from the group consisting of one or more of:

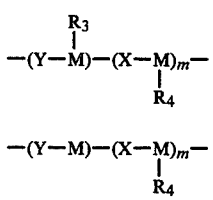

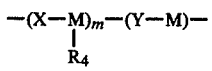

-continued

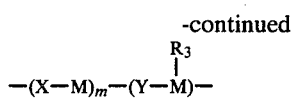

$R_1$, $R_2$ is

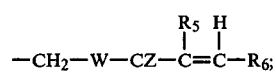

$R_5$ is $H_1$ or $CH_3$
$R_6$ is H, aryl, alkyl, aralkyl or phenoxy phenyl
W is —O— when Z is =O or is absent when Z is $H_2$
Z is $H_2$ or =O
$R_3$ is selected from the group consisting of

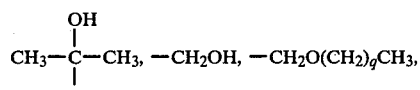

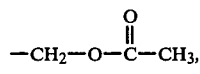

—$CH_2I$, —$CH_2Cl$, —$CH_2Br$ or $R_1$.
where q=0 to 3; and
M is an aromatic radical selected from the group consisting diaryl aliphatic hydrocarbon, diaryl ethers, diaryl sulfides, diaryl sulfones, diaryl amines, diaryl ketones and diaryl diketones; and
$R_4=R_3$
G=X or Y
$R_7=R_4$ when S=X or is absent when S=Y
m=1 to 3
p=1 to 8
Y=—$CH_2OCH_2$—
X=—$CH_2$—; and
(b) a free radical generating photosensitizer in an amount effective to cause the cleavage of said part (a) polymer upon exposure to actinic radiation.

2. The composition of claim 1, wherein M is

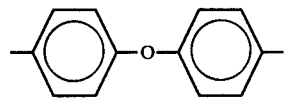

3. The composition of claim 1, wherein the photosensitizer is benzophenone or an analogue of benzophenone.

4. The composition of claim 1, wherein the weight ratio of photosensitizer to polymer is in the range of from about 1:10 to about 5:6.

5. The composition of claim 1 further comprising one or more ingredients selected from the group consisting of binding resins, colorants, light speed accelerators and photostabilizers.

6. The composition of claim 1 wherein said photosensitizer comprising one or more compounds selected from the group consisting of benzophenone, benzil, benzoin, acetophenone, thioxanthone and anthroquinone.

7. The composition of claim 1 wherein M is diphenyl ether or benzophenone, $R_1$ and $R_2$ are methylene cinnamate or phenoxy cinnamate, $R_3$ and $R_4$ are methoxy methyl, m=2, P=3 and the ratio of X to Y is about 2:1.

8. A photographic element which comprises a substrate which is adapted for the support of a photosensitive coating, having the composition of claim 1, 2, 3, 4, 5, 6 or 7 applied to at least one surface thereof.

9. The composition of claim 1 wherein M is diphenyl ether or benzophenone, $R_6$ is phenyl or phenoxy phenyl, $R_5$ is $H_1$, Z is =O and W is —O—.